United States Patent [19]
Law et al.

[11] Patent Number: 5,928,732
[45] Date of Patent: Jul. 27, 1999

[54] METHOD OF FORMING SILICON OXY-NITRIDE FILMS BY PLASMA-ENHANCED CHEMICAL VAPOR DEPOSITION

[75] Inventors: Kam Law, Union City; Jeff Olsen, Saratoga, both of Calif.

[73] Assignee: Applied Materials, Inc., Santa Clara, Calif.

[21] Appl. No.: 08/422,668

[22] Filed: Apr. 10, 1995

Related U.S. Application Data

[63] Continuation of application No. 08/174,095, Dec. 28, 1993, abandoned.

[51] Int. Cl.$^6$ ....................................................... H05H 1/24
[52] U.S. Cl. ........................ 427/579; 427/248.1; 427/294; 427/402; 427/571; 427/574
[58] Field of Search ........................................ 427/579, 574, 427/578, 563, 294, 571, 402, 248.1; 437/241

[56] References Cited

U.S. PATENT DOCUMENTS

| | | | |
|---|---|---|---|
| 4,543,707 | 10/1985 | Ito et al. | 437/228 |
| 4,668,365 | 5/1987 | Foster et al. | 204/192.23 |
| 4,717,631 | 1/1988 | Kaganowicz et al. | 148/33.3 |
| 4,854,263 | 8/1989 | Chang et al. | 118/715 |
| 4,895,734 | 1/1990 | Yoshida et al. | 427/579 |
| 5,164,339 | 11/1992 | Gimpelson | 437/921 |

FOREIGN PATENT DOCUMENTS

| | | |
|---|---|---|
| 0456199 | 11/1991 | European Pat. Off. . |
| 0518544 | 12/1992 | European Pat. Off. . |

OTHER PUBLICATIONS

T.S. Eriksson et al., "RF–Sputtered Silicon–Oxy–Nitride Films," *CIP 85 5th International Colloquium on Plasmas and Sputtering*, Jun. 10–14, 1985, pp. 245–249.

T.S. Eriksson et al., "Infrared Optical Properties of Silicon Oxynitride Films: Experimental Data and Theoretical Interpretation," *Journal of Applied Physics*, vol. 60, No. 6, Sep. 15, 1986, pp. 2081–2091.

T. Hirao et al., "Properties of Silicon Oxynitride Films Prepared by ECR Plasma CVD Method," *Japanese Journal of Applied Physics*, vol. 27, No. 1, Jan. 1988, pp. L21–L23.

W.R. Knolle et al., "Characterization of Oxygen–Doped, Plasma–Deposited Silicon Nitride," *Journal of the Electrochemical Society*, vol. 135, No. 5, May 1988, pp. 1211–1217.

W.R. Knolle et al., "Plasma–Deposited Silicon Oxynitride from Silane, Nitrogen, and Carbon Dioxide or Carbon Monoxide or Nitric Oxide," *Journal of the Electrochemical Society*, vol. 139, No. 11, Nov. 1992, pp. 3310–3316.

*Primary Examiner*—Bernard Pianalto
*Attorney, Agent, or Firm*—Birgit E. Morris

[57] ABSTRACT

A method of producing silicon oxy-nitride films is provided by utilizing a reactant gas mixture of silane, nitrous oxide and nitrogen at a low deposition temperature of less than 250° C. by flowing the reactant gas mixture through a gas inlet manifold which is also an upper electrode in a plasma-enhanced chemical vapor deposition chamber. The gas inlet manifold is the upper plate of a parallel plate plasma chamber for communicating the reactant gas into the chamber. The plate has a plurality of apertures, each comprising an outlet at a chamber or processing side of the plate and an inlet spaced from the processing side, with the outlet being larger than the inlet for enhancing the dissociation and reactivity of the gas.

28 Claims, 1 Drawing Sheet

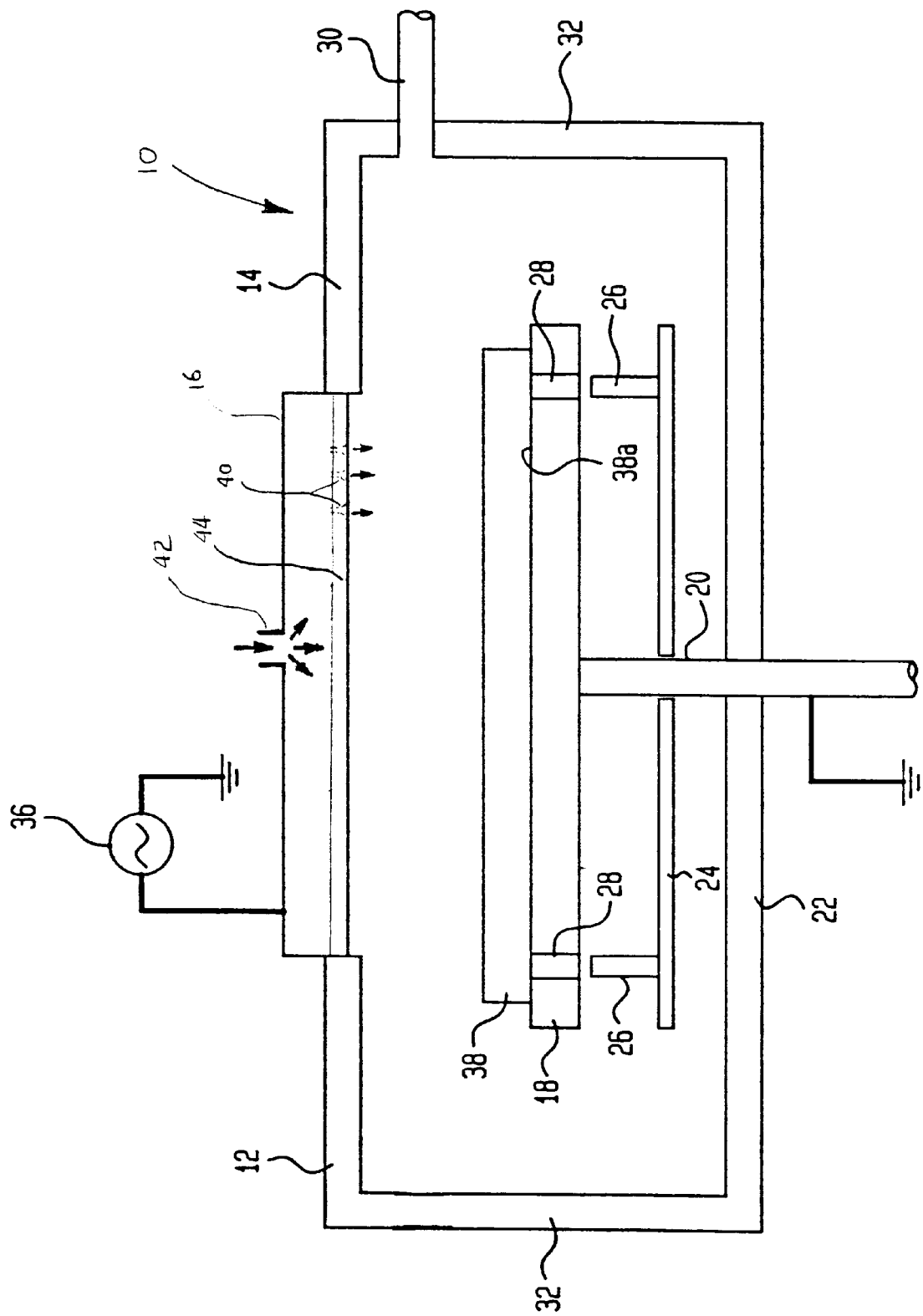

5,928,732

METHOD OF FORMING SILICON OXY-NITRIDE FILMS BY PLASMA-ENHANCED CHEMICAL VAPOR DEPOSITION

This is a continuation of application Ser. No. 08/174,095, filed on Dec. 28, 1993, now abandoned.

FIELD OF THE INVENTION

The present invention generally relates to an improved method of forming silicon oxy-nitride films in a plasma-enhanced chemical vapor deposition (PECVD) process and more particularly, relates to an improved method of forming silicon oxy-nitride films in a PECVD process substantially without using ammonia as a reactant gas.

BACKGROUND OF THE INVENTION

PECVD is a process widely used in the manufacture of semiconductor devices for the deposition of layers of electronic materials on substrates including that of an insulating glass. In PECVD, a substrate body is placed in a vacuum deposition chamber equipped with a pair of parallel plate electrodes or other electrical sources. The substrate body is generally mounted on a susceptor which also serves as the lower electrode. A flow of a reactant gas is provided in the deposition chamber through a gas inlet manifold which also serves as the upper electrode. A radio frequency (RF) voltage is applied between the two electrodes which generate an RF power sufficient to cause a plasma to be formed in the reactant gas. The plasma causes the reactant gas to decompose and deposit a layer of the desired material on the surface of the substrate body. Additional layers of other electronic materials can be deposited on the first layer by providing in the deposition chamber a flow of a reactant gas containing the material of the additional layer to be deposited. Each reactant gas is subjected to a plasma which results in the deposition of a layer of the desired material.

In a conventional PECVD method used to produce silicon oxy-nitride films, an ammonia-based chemistry is used which requires a reactant gas mixture of silane, nitrous oxide, ammonia and nitrogen. In this ammonia-based reaction, silane supplies the silicon content of the film, nitrous oxide supplies the oxygen content of the film, ammonia supplies the nitrogen content of the film and nitrogen gas functions as a diluent. Ammonia is typically used as the source of nitrogen in a silicon oxy-nitride deposition process by the PECVD technique because it is very difficult to break down the triple bond structure in nitrogen gas.

In recent years, the deposition of silicon oxy-nitride films as a final passivation layer on a semiconductor device has become an important processing step in the manufacture of thin film transistors (TFT). This type of thin film transistor has been used to separately address areas of a liquid crystal cell contained between two glass plates at very fast rates. They are useful for active matrix displays such as those used in TV and computer monitors.

When a silicon oxy-nitride film is deposited as the final passivation layer on a thin film transistor, its deposition temperature is greatly limited due to the presence of the layers already built-up on the transistor and their sensitivity to high temperatures. The temperature limitation for the deposition process of the final silicon oxy-nitride layer is frequently limited to a temperature of less than 250° C. This processing temperature is significantly lower than that normally used for the deposition of silicon oxy-nitride films on Si substrates by a PECVD process, i.e., between 350 to 450° C.

At a low processing temperature of less than 250° C., the ammonia-based chemistry for the formation of silicon oxy-nitride films causes many problems in the quality of the films produced. Problems such as porosity and low density are believed to have been caused by the high content of hydrogen atoms in the film contributed by the hydrogen-rich ammonia. The silicon oxy-nitride films formed at such low processing temperatures by the ammonia-based chemistry contain large numbers of pores which are detrimental to the function of the film as a passivation layer. A porous passivation layer would no longer serve its protective function against either physical abrasion or the penetration of contaminants. The conventional method of using ammonia-based chemistry in producing silicon oxy-nitride films on thin film transistors is therefore unacceptable to the TFT industry.

It is therefore an object of the present invention to provide a method of producing silicon oxy-nitride films at low processing temperatures without using an ammonia-based chemistry.

It is another object of the present invention to provide a method of producing silicon oxy-nitride films on thin film transistors by a PECVD process at a processing temperature lower than 250° C. substantially without using ammonia as a reactant gas.

It is a further object of the present invention to provide an improved method of producing silicon oxy-nitride films on thin film transistor substrates by a PECVD method in which a deposition rate of higher than 200 nm/Min can be achieved at a low processing temperature.

SUMMARY OF THE INVENTION

The present invention provides an improved method of forming silicon oxy-nitride films on substrates in a plasma-enhanced chemical vapor deposition chamber at a low processing temperature.

In a preferred embodiment, the improved method of producing silicon oxy-nitride films utilizes a reactant gas mixture of silane, nitrous oxide and nitrogen at a low deposition temperature of less than 250° C. by flowing the reactant gas mixture through a gas inlet manifold. Preferably, the gas inlet manifold is also an electrode in a plasma-enhanced chemical vapor deposition chamber. The gas inlet manifold is one plate of a parallel plate plasma chamber for communicating the reactant gas into the chamber. The plate has a plurality of apertures, each comprising an outlet at a chamber or processing side of the plate and an inlet spaced from the processing side, with the outlet being larger than the inlet for enhancing the dissociation and reactivity of the gas.

The gas inlet manifold enhances the dissociation of nitrogen gas contained in the reactant gas mixture and provides the nitrogen requirement of the silicon oxy-nitride films. The reaction proceeds at a satisfactory deposition rate, i.e., at about 200 nm/Min., even at low processing temperatures of less than 250° C.

The present invention enables the formation of silicon oxy-nitride films at a satisfactory deposition rate that is suitable for a manufacturing process without the use of ammonia-based chemistry. It substantially eliminates all the drawbacks that are associated with ammonia-based chemistry when such processes are carried out at low processing temperatures. High quality silicon oxy-nitride films without the porosity problems can be produced.

The present invention is further directed to silicon oxy-nitride films produced by an ammonia-free chemistry by using a reactant gas mixture of silane, nitrous oxide and nitrogen. Such films can be produced in a manufacturing process conducted at a low processing temperature of less than 250° C. and at a satisfactory deposition rate.

BRIEF DESCRIPTION OF THE DRAWING

Other objects, features and advantages of the present invention will become apparent upon consideration of the specification and the appended drawing of a schematic sectional view of a plasma-enhanced chemical vapor deposition chamber in which the method in accordance with the present invention can be carried out.

DETAILED DESCRIPTION OF THE PREFERRED EMBODIMENT

The present invention includes an improved method of forming silicon oxy-nitride films in a plasma-enhanced chemical vapor deposition chamber by an ammonia-free process at a relatively low processing temperature and at a satisfactory deposition rate.

The sole figure is a schematic sectional view of a plasma-enhanced chemical vapor deposition apparatus 10 in which the method in accordance with the present invention can be carried out. Turner et al. disclose such an apparatus in U.S. patent application Ser. No. 08/010,683, filed Jan. 28, 1993. A deposition chamber 12 includes an opening therethrough a top wall 14 and a first electrode incorporated into gas inlet manifold 16 within the opening. Alternatively, the top wall 14 can be solid with the electrode 16 being adjacent to the inner surface thereof. Within chamber 12 is a susceptor 18 in the form of a plate which extends parallel to the first electrode 16. The susceptor 18 is typically of aluminum and is coated with a layer of aluminum oxide. The susceptor 18 is connected to ground so that it serves as a second electrode. The susceptor 18 is mounted on the end of a shaft 20 which extends vertically through a bottom wall 22 of the deposition chamber 12. The shaft 20 is movable vertically so as to permit the movement of the susceptor 18 vertically toward and away from the first electrode 16. A lift-off plate 24 extends horizontally between the susceptor 18 and the bottom wall 22 of the deposition chamber 12 substantially parallel to the susceptor 18 and is vertically movable. Lift-off pins 26 project vertically upwardly from the lift-off plate 24. The lift-off pins 26 are positioned to be able to extend through lift holes 28 in the susceptor 18, and are of a length slightly longer than the thickness of the susceptor 18. While there are only two lift-off pins 26 shown in the figure, there may be more of the lift-off pins 26 spaced around the lift-off plate 24. A gas outlet 30 extends through a side wall 32 of the deposition chamber 12 and is connected to means (not shown) for evacuating the deposition chamber 12. A gas inlet pipe 42 extends into the first electrode or the gas inlet manifold 16 of the deposition chamber 12, and is connected through a gas switching network (not shown) to sources (not shown) of various gases. The first electrode 16 is connected to an RF power source 36. A transfer paddle (not shown) is typically provided to carry substrates through a load-lock door (not shown) into the deposition chamber 12 and onto the susceptor 18, and also to remove the coated substrate from the deposition chamber 12. Before the deposition process of the invention, the substrate 38, which is a large TFT sheet of glass is processed according to well known TFT techniques.

In the operation of the deposition apparatus 10, a substrate 38 is first loaded into the deposition chamber 12 and is placed on the susceptor 18 by the transfer paddle (not shown). The substrate 38 is of a size to extend over the lift holes 28 in the susceptor 18. A commonly used size for a thin film transistor substrate is approximately 360 mm by 465 mm. The susceptor 18 is positioned above the lift-off pins 26 by moving shaft 20 upwards such that the lift-off pins 26 do not extend through the holes 28, and the susceptor 18 and substrate 38 are relatively close to the first electrode 16. The electrode spacing or the distance between the substrate surface and the discharge surface of the gas inlet manifold 16 is between about 0.5 to about 2 in. A more preferred electrode spacing is between about 0.8 to about 1.4 in.

After the deposition chamber 12 is first evacuated through the gas outlet 30, a reactant gas mixture composed of silane, nitrous oxide and nitrogen is then fed through the gas inlet 42 and the apertures 40 in the gas inlet manifold 16 into the chamber 12. The face plate 44 of the gas inlet manifold 16 incorporates a large number of closely packed specially configured holes or apertures 40. Each aperture 40 has an inlet of relatively small cross-sectional dimension on the gas inlet side (or the relatively high pressure side) of the inlet manifold 16 and an outlet of relatively large dimension on the gas outlet side (or the vacuum chamber side) of the gas inlet manifold 16. This increasing hole diameter in the direction of gas flow increases the dissociation and the reactivity of gases such as nitrogen and thus increases its dissociation rate and correspondingly the deposition rate of the silicon oxy-nitride films. A detailed description of such a gas inlet manifold is contained in commonly assigned U.S. Pat. No. 4,854,263, issued Aug. 8, 1989 which is incorporated by reference herein in its entirety. The use of the increasing-diameter apertures 40 and the face plate 44 incorporating the apertures 40 therefore provides sufficient nitrogen dissociation and consequently high silicon oxy-nitride film deposition rate without the use of an ammonia-based gas chemistry as in conventional silicon oxy-nitride film deposition processes.

To carry out the present invention, the pressure in the deposition chamber is set at between about 0.5 and about 3.5 torr. The RF power source 36 is turned on to provide RF power between the first electrode 16 and the susceptor 18 through the reactant gas mixture. The power is preferably between about 500 and about 2,000 watts with the total power requirement based on the area of the substrate 38 such that it is sufficient to generate a plasma in the reactant gas mixture. The substrate 38 is subjected to the plasma of the reactant gas mixture for at least one second, and preferably between about 2 to 5 seconds. The plasma causes the reactant gas to decompose and deposit a layer of silicon oxy-nitride material on the surface of the substrate 38.

The temperature of the substrate 38 during deposition is maintained at between about 150 and about 250° C., more preferably, between about 180 and about 210° C. This is a relatively low processing temperature and is made necessary in order not to damage the previously deposited layers on the substrate 38 since a silicon oxy-nitride layer is frequently the final passivation layer on such substrate. The reactant gas mixture is maintained by flowing the various reactant gas component into the chamber at suitable flow rates. For instance, for the stated substrate area, silane is normally flowed at a rate of between 150 to 500 sccm, nitrous oxide is flowed into the chamber at a rate of between 100 to 2,000 sccm, and nitrogen is flowed into the chamber at a rate of between 500 to 5,000 sccm. In general, the thickness of the silicon oxy-nitride film layer deposited for passivation purpose varies between about 400 to about 800 nm.

We have discovered that in order to produce satisfactory silicon oxy-nitride films, the nitrogen content in the film must be maintained within a specific range. An optimum range of such content of nitrogen is indicated by a refractive index measurement of such films in between about 1.5 to about 1.9. The measurement of refractive index on the film samples is a simple and reliable method of determining the nitrogen content of the film. For instance, in a silicon dioxide film where no nitrogen is present, the refractive index measurement is approximately 1.46. On the other hand, in a silicon nitride film where no oxygen is present, the refractive index measurement is approximately 1.95. It is therefore a simple and nondestructive method to detect the nitrogen content in a silicon oxy-nitride film by measuring its refractive index. It can also be used as a reliable quality control method for a manufacturing process.

The present invention can be further illustrated in the following Examples 1 through 4, where Examples 1 and 2 are for silicon oxy-nitride film depositions using the conventional ammonia-based chemistry process. Examples 1 and 2 are presented as a comparison to show the benefit achieved by the present invention as illustrated in Examples 3 and 4.

EXAMPLE 1

| Components/Properties | Values |
| --- | --- |
| $SiH_4$ | 200 sccm |
| $NH_3$ | 400 sccm |
| $N_2O$ | 1,000 sccm |
| $N_2$ | 2,000 sccm |
| RF Power | 1,225 watts |
| Pressure | 1.2 torr |
| Electrode Spacing | 1,100 mils |
| Susceptor Temp. | 205° C. |
| Substrate Temp. | 190° C. |
| Refractive Index | 1.54 |
| Wet Etch Rate | 4,718 Å/Min. |

The wet etch rate test is used to determine the film quality, i.e., the lack of porosity thereof, of the silicon oxy-nitride films produced. It is conducted in a 6:1 buffered HF solution. The higher the number obtained, the larger the number of voids or pores are present in the film. A wet etch rate of less than 3,000 Å/Min is considered an acceptable level of film quality in the manufacture of silicon oxy-nitride films as passivation layers.

EXAMPLE 2

| Components/Properties | Values |
| --- | --- |
| $SiH_4$ | 100 sccm |
| $NH_3$ | 400 sccm |
| $N_2O$ | 1,000 sccm |
| $N_2$ | 4,000 sccm |
| RF Power | 1,225 watts |
| Pressure | 1.2 torr |
| Electrode Spacing | 1,100 mils |
| Susceptor Temp. | 205° C. |
| Substrate Temp. | 190° C. |
| Refractive Index | 1.55 |
| Wet Etch Rate | 4,734 Å/Min. |

Comparative Example 2 is another example utilizing the conventional ammonia-based chemistry. The flow rate of $N_2$ is doubled from that of Comparative Example 1 which failed to result in any improvement in film properties as indicated by the wet etch rate.

EXAMPLE 3

| Components/Properties | Values |
| --- | --- |
| $SiH_4$ | 160 sccm |
| $NH_3$ | 0 |
| $N_2O$ | 400 sccm |
| $N_2$ | 1,600 sccm |
| RF Power | 1,200 watts |
| Pressure | 1.2 torr |
| Electrode Spacing | 1,100 mils |
| Susceptor Temp. | 205° C. |
| Substrate Temp. | 190° C. |
| Refractive Index | 1.533 |
| Wet Etch Rate | 1,816 Å/Min. |

Inventive Example 3 shows the present invention that no ammonia gas need be used. The refractive index measurement indicates an adequate amount of nitrogen has been incorporated into the film. The wet etch rate data indicates good film quality and a low content of voids or pores in the film produced.

EXAMPLE 4

| Components/Properties | Values |
| --- | --- |
| $SiH_4$ | 200 sccm |
| $NH_3$ | 0 |
| $N_2O$ | 500 sccm |
| $N_2$ | 2,000 sccm |
| RF Power | 1,500 watts |
| Pressure | 1.0 torr |
| Electrode Spacing | 1,100 mils |
| Susceptor Temp. | 205° C. |
| Substrate Temp. | 190° C. |
| Refractive Index | 1.568 |
| Wet Etch Rate | 1,940 Å/Min. |

Inventive Example 4 also shows the present invention in which no ammonia gas has been used. The gas flow rates for $SiH_4$, $N_2O$ and $N_2$ and the RF power used are higher than that shown in Example 3. The pressure in the reaction chamber used is slightly lower than that in Example 3. Again, a silicon oxy-nitride film having suitable nitrogen content as indicated by the refractive index measurement is obtained. The wet etch rate of 1,940 indicates a good film quality is obtained with few pores in the film.

Although Examples 3 and 4 have not included the use of any ammonia, it is expected that small amounts of ammonia, substantially less than the ammonia content of the prior art, would not seriously degrade the beneficial results of the invention. For instance, to use a reactant gas mixture that is substantially ammonia free would mean a reactant gas mixture that contains ammonia flown in at a flow rate of less than 50 sccm.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, other nitrogen-source gases may be suitably used to replace the nitrogen gas shown in the preferred embodiment to supply the nitrogen content in the film. Other silicon-source gases than silane may be suitably used as the source gas for the silicon content of the film. Similarly, other oxygen-source gases than nitrous oxide may also be used to supply the oxygen content of the silicon oxy-nitride film.

The embodiments of the invention in which an exclusive property or privilege is claimed are defined as follows:

1. A method for depositing a silicon oxy-nitride film on a substrate in a plasma-enhanced chemical vapor deposition chamber equipped with a first electrode and a second electrode, comprising the step of:

reacting at a deposition temperature of less than about 250° C. and at a deposition pressure of between about 0.5 and 3.5 torr a reactant gas mixture that is substantially ammonia-free such that a silicon oxy-nitride film is deposited on a previously formed semiconductor structure on a substrate, whereby a separation of a first and second electrode is substantially less than a lateral size of said substrate to preclude the use of magnetic field enhancement with said method for depositing.

2. A method according to claim 1, wherein said separation is between 0.5 and 2 inches.

3. A method according to claim 1, wherein said previously formed semiconductor structure is a thin film transistor.

4. A method according to claim 1, wherein said previously formed semiconductor structure is a thin film transistor on a glass support.

5. A method according to claim 1, wherein said reactant gas mixture comprises a silicon-source gas, an oxygen-source gas and a nitrogen-source gas.

6. A method according to claim 5, wherein said silicon-source gas comprises silane, said oxygen-source gas comprises nitrous oxide, and said nitrogen-source gas comprises nitrogen.

7. A method according to claim 6, wherein said silane is flowed into said chamber at a rate of between 150 and 500 sccm, said nitrous oxide is flowed into said chamber at a rate of between 100 and 2,000 sccm, and said nitrogen is flowed into said chamber at a rate of between 500 and 5,000 sccm.

8. A method according to claim 1, wherein said silicon oxy-nitride film layer is deposited as a passivation layer.

9. A method according to claim 1, wherein said previously formed semiconductor structure is formed out of a previously deposited intermediate film layer in contact with said substrate.

10. A method according to claim 1, wherein said previously formed semiconductor structure is a thin-film transistor.

11. A method according to claim 1, wherein said silicon oxy-nitride film is deposited at a rate of no less than 200 nm/min.

12. A method for depositing a silicon oxy-nitride film on a substrate in a processing chamber equipped with a first electrode and a second electrode, comprising the steps of:

maintaining a substrate at a temperature of not higher than about 250° C., maintaining a plasma-enhanced chemical vapor deposition chamber at a pressure of between about 0.5 and 3.5 torr, flowing a reactant gas mixture substantially not containing ammonia into said chamber, and igniting a plasma in said reactant gas mixture for a sufficient length of time such that said silicon oxy-nitride film is deposited on a previously formed semiconductor structure on a substrate, whereby a separation of a first and second electrodes is substantially less than a lateral size of said substrate to preclude the use of magnetic field enhancement with said method for depositing.

13. A method according to claim 12, wherein said reactant gas mixture comprises silane, nitrous oxide and nitrogen.

14. A method according to claim 13, wherein said silane is flowed into said chamber at a rate of between 150 and 500 sccm, said nitrous oxide is flowed into said chamber at a rate of between 100 and 2,000 sccm, and said nitrogen is flowed into said chamber at a rate of between 500 and 5,000 sccm.

15. A method according to claim 12, wherein said partially formed semiconductor structure is a thin-film transistor.

16. A method according to claim 12, wherein said silicon oxy-nitride film produced has a thickness between about 400 and about 800 nm.

17. A method according to claim 12, wherein said silicon oxy-nitride film is deposited at a rate of no less than 200 nm/min.

18. A method according to claim 12, wherein said separation is between 0.5 and 2 inches.

19. A method for depositing a silicon oxy-nitride film on a substrate in a processing chamber equipped with a gas inlet manifold and a first electrode and a second electrode, comprising the steps of:

loading a substrate including thereon a previously formed semiconductor structure into a plasma-enhanced chemical vapor deposition chamber, maintaining said substrate at a temperature of not higher than about 250° C., maintaining said chamber at a pressure of between about 0.5 and 3.5 torr, flowing a reactant gas mixture substantially not containing ammonia into said chamber through said gas inlet manifold, creating a plasma of said reactant gas mixture in said chamber, and depositing a layer of a silicon oxy-nitride film on said previously formed semiconductor structure from said reactant gas, whereby said silicon oxy-nitride film deposited is substantially without voids, whereby a separation of a first and second electrode is substantially less than a lateral size of said substrate to preclude the use of magnetic field enhancement with said method for depositing.

20. A method according to claim 19, wherein said reactant gas mixture comprises silane, nitrous oxide and nitrogen.

21. A method according to claim 20, wherein said silane is flowed into said chamber at a rate of between 150 and 500 sccm, said nitrous oxide is flowed into said chamber at a rate of between 100 and 2,000 sccm, and said nitrogen is flowed into said chamber at a rate of between 500 and 5,000 sccm.

22. A method according to claim 19, wherein said silicon oxy-nitride film deposited is a final passivation layer on said previously formed semiconductor structure.

23. A method according to claim 19, wherein said silicon oxy-nitride film produced has a refractive index between about 1.5 and about 1.9.

24. A method according to claim 19, wherein said silicon oxy-nitride film produced has a wet etch rate determined in a 6:1 buffered HF solution of not higher than 3,000 Å/min.

25. A method according to claim 19, wherein said gas inlet manifold comprises a plurality of apertures, each comprising an outlet at the chamber or processing side of the manifold and an inlet spaced from the processing side, with the outlet being larger than the inlet for enhancing the dissociation and reactivity of the gas.

26. A method according to claim 19, wherein said previously formed semiconductor structure is maintained at a temperature of between 180 and 210° C.

27. A method according to claim 19, wherein said silicon oxy-nitride film is deposited at a rate of no less than 200 nm/min.

28. A method according to claim 19, wherein said separation is between 0.5 and 2 inches.

* * * * *